United States Patent
Zettler et al.

(10) Patent No.: US 10,606,686 B2
(45) Date of Patent: *Mar. 31, 2020

(54) DIVERSE INTEGRATED PROCESSING USING PROCESSORS AND DIVERSE FIRMWARE

(71) Applicant: Infineon Technologies AG, Neubiberg (DE)

(72) Inventors: Thomas Zettler, Hohenkirchen (DE); Dirk Hammerschmidt, Villach (AT); Friedrich Rasbornig, Klagenfurt (AT); Michael Strasser, Villach (AT); Akos Hegedus, Budapest (HU); Wolfgang Granig, Seeboden (AT)

(73) Assignee: Infineon Technologies AG (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/032,609

(22) Filed: Jul. 11, 2018

(65) Prior Publication Data

US 2018/0322000 A1  Nov. 8, 2018

Related U.S. Application Data

(63) Continuation of application No. 15/208,072, filed on Jul. 12, 2016, now Pat. No. 10,042,693.

(51) Int. Cl.
*G06F 11/00* (2006.01)
*G06F 11/07* (2006.01)
(Continued)

(52) U.S. Cl.
CPC ............ *G06F 11/079* (2013.01); *G01K 7/00* (2013.01); *G01L 1/00* (2013.01); *G01P 3/00* (2013.01);
(Continued)

(58) Field of Classification Search
CPC ...... G06F 11/25; G06F 11/267; G06F 11/3409
(Continued)

(56) References Cited

U.S. PATENT DOCUMENTS 6,983,398 B2 * 1/2006 Prabhu ................ G06F 11/2236
714/12
2015/0379306 A1 * 12/2015 Zimmer ................ G06F 21/72
713/193

(Continued)

FOREIGN PATENT DOCUMENTS

CN        104048692 A        9/2014

OTHER PUBLICATIONS

Fakk, CS 150, Computer Organization, http://de.slideshare.net/fullscreen/mohammedarif89/computer-organisation, 2000.
(Continued)

*Primary Examiner* — Sarai E Butler

(74) *Attorney, Agent, or Firm* — Design IP

(57) ABSTRACT

Fault detection devices, systems and methods are provided which implement identical processors. A first processor is configured to receive a first set of variables, execute a first firmware based on the first set of variables, and output a first result of the executed first firmware. A second processor, identical to the first processor, is configured to receive a second set of variables, execute a second firmware based on the second set of variables, and output a second result of the executed second firmware. The first firmware and the second firmware provide a same nominal function in a diverse manner for calculating the first result and the second result, (Continued)

respectively, such that the first result and the second result are expected to be within a predetermined margin. Thus, a fault can be detected by comparing the first and the second results.

20 Claims, 5 Drawing Sheets

(51) Int. Cl.

| | | |
|---|---|---|
| G01R 33/09 | (2006.01) | |
| G06F 11/16 | (2006.01) | |
| G01K 7/00 | (2006.01) | |
| G01L 1/00 | (2006.01) | |
| G01P 3/00 | (2006.01) | |
| G01P 15/00 | (2006.01) | |
| G01R 33/00 | (2006.01) | |
| G01P 21/00 | (2006.01) | |

(52) U.S. Cl.
CPC .......... *G01P 15/00* (2013.01); *G01R 33/0023* (2013.01); *G01R 33/09* (2013.01); *G06F 11/0739* (2013.01); *G06F 11/0751* (2013.01); *G06F 11/165* (2013.01); *G06F 11/1641* (2013.01); *G01P 21/00* (2013.01); *G06F 2201/81* (2013.01)

(58) Field of Classification Search
USPC .......................................................... 714/39
See application file for complete search history.

(56) References Cited

U.S. PATENT DOCUMENTS

| | | | |
|---|---|---|---|
| 2016/0098688 A1* | 4/2016 | Hunt | G06Q 20/18 |
| | | | 705/308 |
| 2016/0203103 A1* | 7/2016 | Yu | G06F 12/0246 |
| | | | 711/103 |

OTHER PUBLICATIONS

Hennessey, John L and David A. Patterson, Computer Architecture, Fifth Edition: A Quantitative Approach (The Morgan Kaufmann Series in Computer Architecture and Design), Elsevier: 2011, pp. 1-12.

Braun, Juergen, "Safeguarding Fail-Safe and Fail-Operational Systems with Coded Processing", "eMobility eMotion" Conference Sep. 25-26, 2013, Toulouse, France, pp. 1-15.

Susskraut, Martin and Jorg Kaienburg, "Diversified Encoding with Coded Processing (Workshop)", SIListra Systems GmbH, Mar. 25, 2015, pp. 1-21.

Chavarria, Jose, "Simatic PCS 7", Siemens AG, 2007, PLC Forum, pp. 18-23 and 60-84.

Susskraut, Martin and Jorg Kaienburg, "Diversified Encoding with Coded Processing", SIListra Systems GmbH, Mar. 24, 2015, pp. 1-23.

* cited by examiner

DIVERSE INTEGRATED PROCESSING USING PROCESSORS AND DIVERSE FIRMWARE

CROSS REFERENCE TO RELATED APPLICATIONS

This application is a continuation of U.S. patent application Ser. No. 15/208,072, filed Jul. 12, 2016, which is incorporated by reference as if fully set forth.

FIELD

The present disclosure relates generally to a devices, systems and to methods for detecting a fault in a system, and more particularly, to diverse integrated processing using identical processors and diverse firmware.

BACKGROUND

Functional safety of electronic systems in automotive passenger cars is an important topic in the light of increasing automation and semiconductor content of modern cars. It is desirable to have a reliable and safe functionality for the safety critical parts deployed in the system.

One requirement which may often exist in such safety-critical applications is that malfunctions of a sensor device have to be detectable by the system, for example by an entity receiving signals from the sensor device. In other words, according to such a requirement it has to be possible to detect, if a sensor device delivers erroneous values, e.g. due to a fault of the sensor device. One approach to ensure this is to provide redundancy, for example to provide two separate sensors for measuring the same physical quantity. Deviations between measurements of the two sensor devices above a threshold may indicate a malfunction of at least one of the two sensors provided. However, providing such redundancy requires additional chip space.

Further, hardware solutions may use different types of processors which are developed using different hardware architectures. Different hardware architectures require at least doubled verification effort to reach the same quality as compared with a duplicated homogenous redundant architecture. Moreover, the implementation of the same functionality in on the different architectures is error prone and implies a high risk that corner cases behave differently in an unintended manner. A corner case typically involves a problem or situation that occurs only outside of normal operating parameters, specifically one that manifests itself when multiple environmental variables or conditions are simultaneously at extreme levels, even though each parameter is within the specified range for that parameter.

Further, floating point and fixed point architectures may be used in parallel to perform actual mathematical calculations in a redundant manner. The results are compared and the difference in the results is analyzed to determine whether is it within a margin specified by the calculation precisions. In general, this implementation is not efficient since it requires implementation with fixed and floating points which limits this application to processors supporting both fixed point and floating points. Moreover, some calculations can be subject to the same systematic failure even if they are implemented as fixed and floating points.

Another known implementation is called "coded processing" with AN-Coding as one example. AN-Coding is a method of extending a data numberspace. The original data is multiplied before processing with specific code and later checked if the calculated result is still in the expected numberspace. This method is primarily used to protect a single processor function against incorrect calculation.

However, this type of coding increases the required bitwidth for the numberspace which is a severe disadvantage for embedded computing and especially firmware. Higher bitwidth also implies more routing wires and higher transistor counts in the whole architecture which increases the amount of failure possibilities. This also explains why this method found so far only in applications of process computers that use a high hardware complexity.

SUMMARY

Embodiments provide a fault detection system that includes a first processor configured to receive a first measurement, execute a first firmware based on the first measurement, and output a first result of the executed first firmware, and a second processor identical to the first processor and configured to receive a second measurement, execute a second firmware based on the second measurement, and output a second result of the executed second firmware. The first firmware and the second firmware provide a same nominal function in a diverse manner for calculating the first result and the second result, respectively, such that the first result and the second result are expected to be within a predetermined margin.

The fault detection system may further include a first comparison component configured to compare the first result with the second result and output a comparison result, and a second comparison component configured to receive the comparison result, determine whether a fault exists based on the comparison result and the predetermined margin, and output a fault detection signal on a condition that a fault is detected.

Embodiments provide a method for detecting a fault, including executing a first firmware, by a first processor, including receiving a first measurement, executing a first algorithm based on the first measurement, and outputting a first result of the executed first algorithm, and executing a second firmware, by a second processor identical to the first processor, including receiving a second measurement, executing a second algorithm based on the second measurement, and outputting a second result of the executed second algorithm. The first firmware and the second firmware provide a same nominal function in a diverse manner for calculating the first result and the second result, respectively, such that the first result and the second result are expected to be within a predetermined margin.

The method may further include comparing the first result with the second result and outputting a comparison result, determining whether a fault exists based on the comparison result and the predetermined margin, and outputting a fault detection signal on a condition that a fault is detected.

BRIEF DESCRIPTION OF THE DRAWINGS

Embodiments are described herein making reference to the appended drawings.

DETAILED DESCRIPTION

Figure 1:
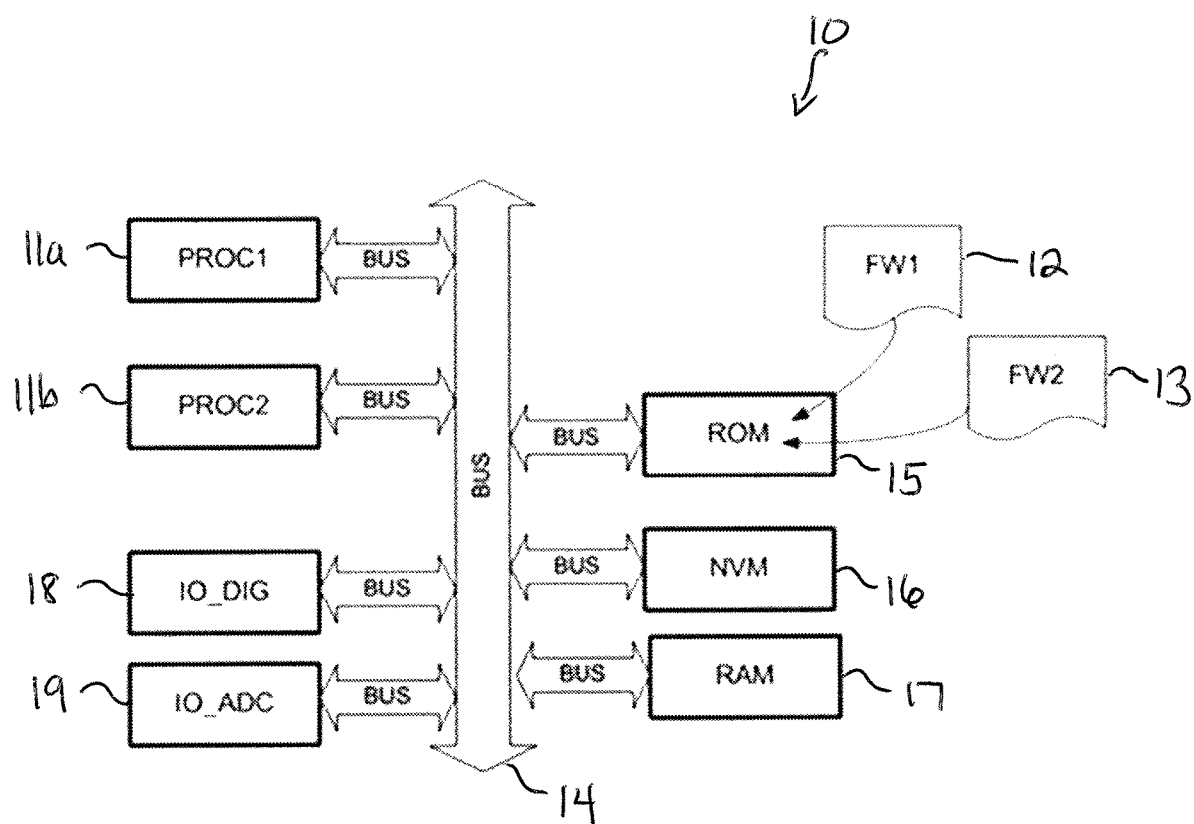
FIG. 1 is a block diagram of an example integrated circuit according to one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to sensors and sensor systems and to obtaining information about sensors and sensor systems. A sensor, as already mentioned in the background section, may refer to a component which converts a physical quantity to be measured to an electric signal, for example a current signal or a voltage signal. The physical quantity may for example comprise a magnetic field, an electric field, a pressure, a force, a current or a voltage, but is not limited thereto.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

Embodiments described herein provide a diverse and redundant safety function which is founded on the usage of identical hardware implementation of microprocessors executing diverse firmware code or algorithms (e.g., each identical or redundant microprocessor is configured to execute a firmware code that is different from each firmware code of other identical or redundant microprocessor(s)). It will be appreciated that the terms "microprocessors", "processors" and "processor cores" may be used interchangeably throughout the disclosure. It will be further appreciated that the concepts described herein is not limited to safety functions, and may be implemented in any device or system that uses fault/error detection.

Identical hardware for multiple microprocessors may be integrated into a single silicon die (e.g., integrated/embedded microprocessors) or may be provided on separate dies.

Several methods and implementations of diverse firmware code are described. For example, one or more embodiments may be configured to implement a critical function in a redundant and diverse way in order to ensure any deviation of the required function by a mismatch between the redundant implementations is detected. The firmware for each processor, while diverse, provide the same nominal function such that the expected result is the same or within an acceptable or anticipated margin. Thus, the firmware codes/algorithms are mathematically equivalent but are implemented in a different, diverse manner such that the results of each calculation or function of each processor can be compared to each other, and the results used for detecting a fault.

It will be appreciated that a first result R1 of a first firmware FW1 and a second result R2 of a second firmware FW2 may be analyzed to determine whether the results are equal to each other (e.g. R1=R2) or are less than (or less than or equal to) a predetermined margin or threshold (e.g., |R1−R2|<margin 1 or |R1+R2|<margin 2, where |"x"| indicates the absolute value of x and margin 1 and margin 2 can be the same or different). It is noted that the margin or threshold may be zero or some other value.

It will be appreciated that the terms "codes", "algorithms" and "equations" may be used interchangeably throughout the disclosure.

Further, one or more embodiments may provide a solution which minimizes the complexity of hardware and effort for hardware verification without compromising the safety in any way.

FIG. 1 shows a block diagram of an example integrated circuit (IC) 10 with (at least) two identical microprocessors PROC1 11*a*, PROC2 11*b* that implement a diverse safety function via diverse firmware codes FW1 12 and FW2 13. The IC 10 includes a bus architecture 14, composed of one or more buses, configured to transfer data, control information and/or instructions between one or more components of the IC 10. The IC 10 may further include a read-only memory (ROM) 15, a non-volatile memory (NVM) 16, a random-access memory (RAM) 17, a digital input output stage IO_DIG 18 and an analogue input output stage IO_ADC 19 connected via the bus architecture 14. The digital input output stage IO_DIG 18 and/or the analogue input output stage IO_ADC 19 may receive one or more measurements from one or more sensors (not shown) according to a trigger or sampling time. Thus, a processor function of the IC 10 may include one or more data paths and one or more control paths provided by the bus architecture 14 and one or more components. Two or more measurements (e.g., at least one provided for each processor) may be identical to each other such that the expected results output by the firmware FW1, FW2 are expected to be the same or within an acceptable margin of error. It will be appreciated that the measurements (i.e., measurement signals) may be of the same polarity or inverse to each other, as long as the results output from the firmware FW1, FW2 can be analyzed and used to detect a fault in a diverse manner.

It will be appreciated that a first result R1 of a first firmware FW1 and a second result R2 of a second firmware FW2 may be analyzed to determine whether the results are equal to each other (e.g. R1=R2) or are less than (or less than or equal to) a predetermined margin or threshold (e.g., |R1−R2|<margin 1 or |R1+R2|<margin 2, where |"x"| indicates the absolute value of x and margin 1 and margin 2 can be the same or different). It is noted that the margin or threshold may be zero or some other value.

The two diverse firmware codes FW1 and FW2 may be stored in the ROM 15 and accessed by their corresponding microprocessor PROC1, PROC2 via the bus architecture 14.

The two microprocessors PROC1, PROC2 are configured via their corresponding firmware codes FW1, FW2 to calculate two safety relevant results which are then compared by a comparison module or component, which is any device that is configured to compare two or more inputs (e.g., comparator, processor, and the like). The comparison module or component may further output one or more comparison results or may further determine whether a fault is present based on the comparison results, and output a fault detection signal if a fault is detected. The comparison result(s) may be compared, by a comparison module, comparison component or other determination component, to a threshold using a threshold test or to a predetermined margin to determine whether an error or fault exists in the system.

For example, the results calculated by the microprocessors PROC1, PROC2 may be compared by a digital signal processor (DSP) of one of microprocessors PROC1, PROC2, by another processor (not shown) included in the IC 10, by an external processor (not shown) located "off-chip" (e.g., an external electronic control unit (ECU)) that receives the results from the IC 10 via one of the digital and analogue input output stages IO_DIG 18 and IO_ADC 19, and/or by a comparator located on or off-chip connected to one of the digital and analogue input output stages IO_DIG 18 and IO_ADC 19. For example, one of the digital and analogue input output stages IO_DIG 18 and IO_ADC 19 may receive each result from the microprocessors PROC1 11a, PROC2 11b, RAM 17, or the like and output the results to an external device (e.g., an ECU). There may be one or more comparison stages by a same or different comparison/determination module or component in order to make a fault determination and output a fault detection signal.

Alternatively to storing the firmware in ROM 15, the program firmware code FW1 12 and FW2 13 may be in stored in the NVM 16 given that the access time is fast enough to cope with the requirements of microprocessors PROC1 11a and PROC2 11b. The NVM 16 may be any type of NVM, including programmable read-only memory (PROM) (e.g., Erasable Programmable Read-Only Memory (EEPROM), flash memory, and the like.

The RAM 17 may be further configured to store intermediate results of the microprocessors PROC1 11a and PROC2 11b.

The IO_DIG 18 may include a digital interface for receiving digital signals from any of the above-identified components, and outputting the digital signals, with or without further digital signal processing, to an external device.

The IO_ADC 19 may include an analogue interface, for receiving analogue signals from any of the above-identified components, with a processor (e.g., analog to digital (ADC) processor) embedded therein. Thus, the IO_ADC 19 may output analogue and/or digital signals to an external device.

Figure 2:
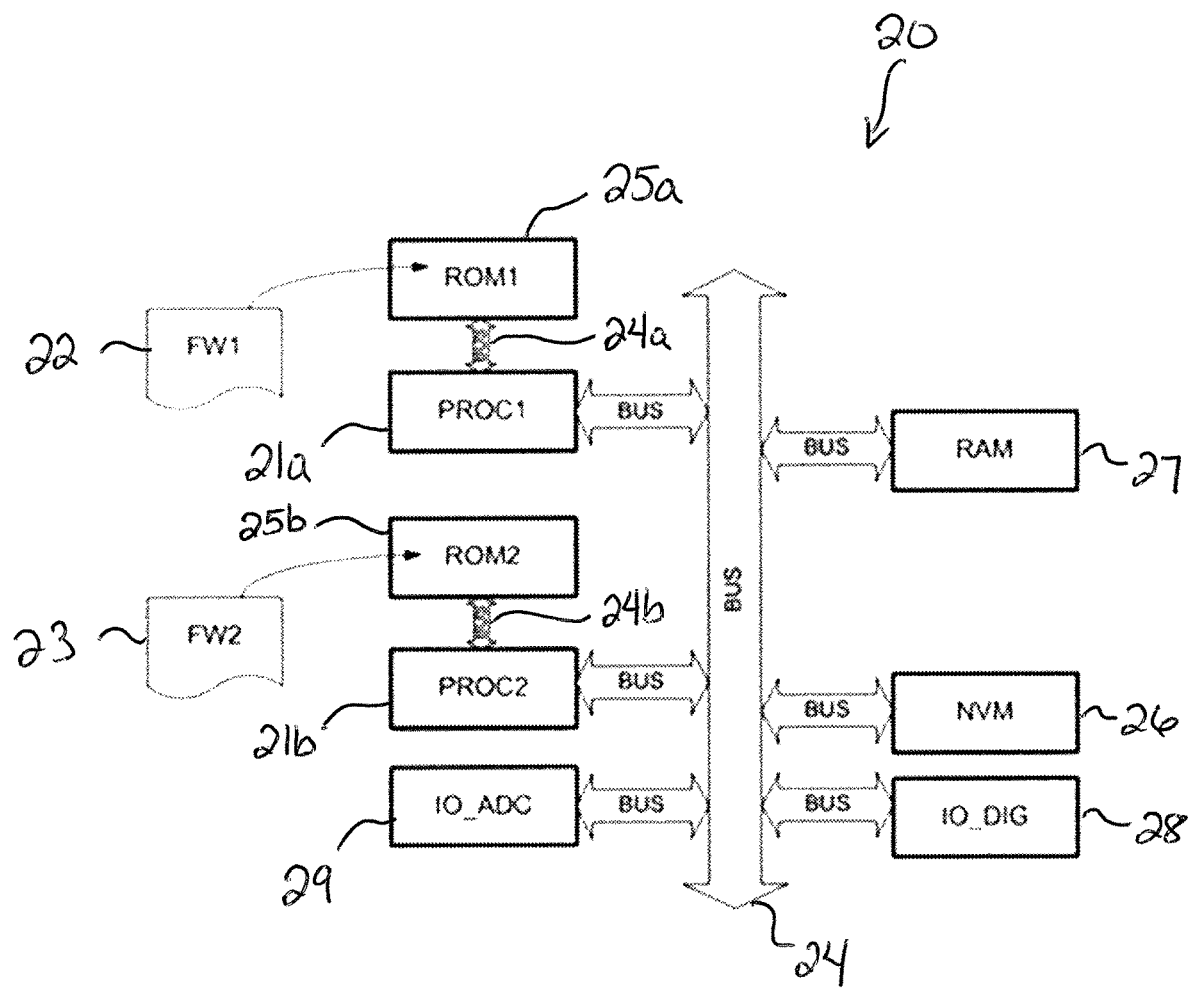
FIG. 2 is a block diagram of another example integrated circuit according to one or more embodiments.

FIG. 2 shows a block diagram of an example IC 20 with (at least) two microprocessors PROC1 21a, PROC2 21b that implement a diverse safety function via diverse firmware codes FW1 22 and FW2 23, the results of which are compared as described herein. The IC 20 includes a bus architecture 24 configured to transfer data, control information and/or instructions between one or more components of the IC 20.

The IC 20 may further include (at least) two ROMs 25a and 25b connected to a corresponding one of the two microprocessors PROC1 21a, PROC2 21b. Thus, as a further safety consideration, each microprocessor PROC1 21a, PROC2 21b may be connected via a dedicated bus 24a and 24b to a dedicated ROM1 25a and ROM2 25b that store the corresponding firmware code FW1 22, FW2 23 for the microprocessors PROC1 21a, PROC2 21b. Since ROM1 25a and ROM2 25b are separate (i.e., mutually exclusive) from each other, the overall system is protected by the added redundancy should one of the ROMs fail.

The dedicated buses 24a and 24b provide a control path from the ROM1 and ROM2 to the microprocessors PROC1, PROC2, respectively. Thus, the redundancy in IC 20 is increased, and should one path fail, the other path may remain valid.

The IC 20 may further include an NVM 26, a RAM 27, a digital input output stage IO_DIG 28 and an analogue input output stage IO_ADC 29 connected via the bus architecture 24. The digital input output stage IO_DIG 28 and/or the analogue input output stage IO_ADC 29 may receive one or more measurements from one or more sensors (not shown) according to a trigger or sampling time. Thus, a processor function of the IC 20 may include one or more data paths and one or more control paths provided by the bus architecture 24 and one or more components. Two or more measurements (e.g., at least one provided for each processor) may be identical to each other such that the expected results output by the firmware FW1, FW2 are expected to be the same or within an acceptable margin of error. It will be appreciated that the measurements (i.e., measurement signals) may be of the same polarity or inverse to each other, as long as the results output from the firmware FW1, FW2 can be analyzed and used to detect a fault in a diverse manner.

It will be appreciated that a first result R1 of a first firmware FW1 and a second result R2 of a second firmware FW2 may be analyzed to determine whether the results are equal to each other (e.g. R1=R2) or are less than (or less than or equal to) a predetermined margin or threshold (e.g., |R1−R2|<margin 1 or |R1+R2|<margin 2, where |"x"| indicates the absolute value of x and margin 1 and margin 2 can be the same or different). It is noted that the margin or threshold may be zero or some other value.

Alternatively, the program firmware code FW1 22 and FW2 23 may be in stored in a dedicated NVM (not shown), instead of a dedicate ROM, given that the access time is fast enough to cope with the requirements of microprocessors PROC1 21a and PROC2 21b. An NVM may be any type of NVM, including programmable read-only memory (PROM) (e.g., Erasable Programmable Read-Only Memory (EEPROM), flash memory, and the like.

The RAM 27 may be further configured to store intermediate results of the microprocessors PROC1 21a and PROC2 21b.

The IO_DIG 28 may include a digital interface for receiving digital signals from any of the above-identified components, and outputting the digital signals, with or without further digital signal processing, to an external device.

The IO_ADC 29 may include an analogue interface, for receiving analogue signals from any of the above-identified components, with a processor (e.g., an ADC processor) embedded therein. Thus, the IO_ADC 29 may output analogue and/or digital signals to an external device.

Examples of diverse firmware codes FW1 and FW2 are provide below which provide diverse functions, including diverse addition, diverse multiplication, and diverse polynomials. Two diverse codes FW1, FW2 are shown below in a mathematical notation for simplification. However, it will be appreciated by those knowledgeable in the field that the codes FW1, FW2 are implemented in a binary code or assembler language specific to the processors PROC1 and PROC2.

Both codes FW1 and FW2 provide the same nominal function (e.g., addition, multiplication, polynomial, etc.). That is, the diverse firmware codes FW1 and FW2 are mathematically equivalent to each other with a different implementation of the nominal function. For example, a number of instructions (e.g., operation codes or opcodes), a sequence of instructions (e.g., operation codes or opcodes) and/or order of operations (or operator precedence) may be different between the firmware codes. Furthermore, a program length of firmware codes FW1 and FW2 may be different. It will be further appreciated that, while two diverse firmware codes are provided, more than two diverse firmware codes may be implemented, one for each redundant processor.

A first example of diverse addition algorithms is provided:

$$FW1)\ A=B+C \qquad \text{Equation 1a}$$

$$FW2)\ A=(B*\text{alpha})+C+(B*\text{beta}),\ \text{where alpha+beta=1} \qquad \text{Equation 1b}$$

In the first example of diverse addition, A is a function result (e.g., a magnetic field value, offset value, gain value, etc.), B is an output (e.g., a raw value) from a first sensor measured at a first time, C is an second output from the first sensor measured at a second instance in time, an output from a second sensor or a constant value that is stored in a NVM (e.g., EEPROM, ROM, etc.), and the values of alpha and beta are such that the sum of alpha and beta equals 1. The second sensor may be the same type of sensor as the first sensor, and furthermore may be identical to the first sensor, and provides a measurement at a same or different time and/or location as to the first sensor. For example, B may be a raw measurement value of a magnetic sensor and C may be an additional sensor value (e.g., temperature measurement value) from a temperature sensor. It will be appreciated by those knowledgeable in the field that a number of instructions and sequence of instructions to perform Equations 1a and 1b are different from each other, but the result A should be the same when a processor, sensor and/or system is operating normally. Thus, Equations 1a and 1b are mathematically equivalent.

A sensor may include any sensor that measures and/or detects a property, event and/or change in environment and outputs a result in the form of an electrical or optical signal (e.g., a magnetic field sensor, position sensor, speed sensor, acceleration sensor, pressure sensor, temperature sensor, stress sensor, etc.). A magnetic field sensor may further include a Hall sensor or a magnetoresistance sensor xMR (e.g., giant magnetoresistance (GMR), tunneling magnetoresistance (TMR), anisotropic magnetoresistance (AMR), colossal magnetoresistance (CMR), etc.).

One or more sensors may be provided in a same package on a same die or on different packages on different dies. Furthermore, one or more sensors may be located inside a package, outside a package, located side-by-side, and/or stacked to one another. Furthermore, each firmware may be stored in a memory integrated on the same die as the corresponding sensor.

A second example of diverse addition algorithms is provided:

$$FW1)\ A=B+C \qquad \text{Equation 2a}$$

$$FW2)\ A=(B\ \text{AND}\ \text{AAAAh})+(C\ \text{AND}\ \text{AAAAh})+(B\ \text{AND}\ 5555h)+(C\ \text{AND}\ 5555h) \qquad \text{Equation 2b}$$

In the second example of diverse addition, symbols A, B and C represent variables similarly described with respect to the first example of diverse addition. In addition, "AAAAh" and "5555h" are masks (e.g., deconstruction masks or mask values), in which the "h" indicates that the value is represented in hexadecimal format (e.g., "AAAA" or "5555"). The "AND" represents a logical AND operation.

Equation 2b may be further represented in general form as Equation 2c:

$$FW2')\ A=(B\ \text{AND}\ Y_1Y_2Y_3Y_4h)+(C\ \text{AND}\ Y_1Y_2Y_3Y_4h)+(B\ \text{AND}\ Z_1Z_2Z_3Z_4h)+(C\ \text{AND}\ Z_1Z_2Z_3Z_4h) \qquad \text{Equation 2c}$$

In Equation 2c, $Y_1Y_2Y_3Y_4$ and $Z_1Z_2Z_3Z_4$ relate generally to a string of hexadecimal numbers used as a mask (i.e., mask values), where $Y_1Y_2Y_3Y_4h+Z_1Z_2Z_3Z_4h=FFFFh$, for example. Thus, the equations are mathematically equivalent.

A third example of diverse addition algorithms is provided:

$$FW1)\ A=B+C \qquad \text{Equation 3a}$$

$$FW2)\ A=B \qquad \text{Equation 3b}$$

repeat, until C=0
   A=A+1
   C=C−1

In the third example of diverse addition, symbols A, B and C represent variables similarly described with respect to the first example of diverse addition. Thus, the equations are mathematically equivalent.

A fourth example of diverse addition algorithms is provided:

$$FW1)\ A=B+C \qquad \text{Equation 4a}$$

$$FW2)\ B1=B+D; \qquad \text{Equation 4b}$$

C1=C−D; and
A=B1+C1

In the fourth example of diverse addition, symbols A, B and C represent variables similarly described with respect to the first example of diverse addition. In addition, D may be any arbitrary number, either fixed or changing every calculation, and B1 and C1 are function results. Thus, the equations are mathematically equivalent.

A first example of diverse multiplication algorithms is provided:

$$FW1)\ A=B*C \qquad \text{Equation 5a}$$

$$FW2)\ A=B*(C*\text{alpha})+(B*\text{beta})*C,\ \text{where alpha+beta=1} \qquad \text{Equation 5b}$$

In the first example of diverse multiplication, symbols A, B and C represent variables similarly described with respect to the first example of diverse addition. In addition, the values of alpha and beta are such that the sum of alpha and beta equals 1. Thus, the equations are mathematically equivalent.

A second example of diverse multiplication algorithms is provided:

$$FW1)\ A=B*C \qquad \text{Equation 6a}$$

$$FW2)\ A=0 \qquad \text{Equation 6b}$$

repeat, until C=0
A=A+B
C=C−1

In the second example of diverse multiplication, symbols A, B and C represent variables similarly described with respect to the first example of diverse addition. Thus, the equations are mathematically equivalent.

A third example of diverse multiplication algorithms is provided:

$$FW1)\ A=B*C \qquad \text{Equation 7a}$$

$$FW2)\ A=((B+C)^2-B^2-C^2)/2 \qquad \text{Equation 7b}$$

In the third example of diverse multiplication, symbols A, B and C represent variables similarly described with respect to the first example of diverse addition. Thus, the equations are mathematically equivalent.

A fourth example of diverse multiplication algorithms is provided:

$$FW1)\ A=B*C \qquad \text{Equation 8a}$$

$$FW2)\ A=(B^2+C^2-(B-C)^2)/2 \qquad \text{Equation 8b}$$

In the fourth example of diverse multiplication, symbols A, B and C represent variables similarly described with respect to the first example of diverse addition. Thus, the equations are mathematically equivalent.

A fifth example of diverse multiplication algorithms is provided:

$$FW1)\ A=B*C \qquad \text{Equation 9a}$$

$$FW2)\ A=(B\ \text{AND AAAAh})*(C\ \text{AND AAAAh})+(B\ \text{AND AAAAh})*(C\ \text{AND 5555h})+(B\ \text{AND 5555h})*(C\ \text{AND AAAAh})+(B\ \text{AND 5555h})*(C\ \text{AND 5555h}) \qquad \text{Equation 9b}$$

Equation 9b may be further represented in general form as Equation 9c:

$$FW2')\ A=(B\ \text{AND}\ Y_1Y_2Y_3Y_4h)*(C\ \text{AND}\ Y_1Y_2Y_3Y_4h)+(B\ \text{AND}\ Y_1Y_2Y_3Y_4h)*(C\ \text{AND}\ Z_1Z_2Z_3Z_4h)+(B\ \text{AND}\ Z_1Z_2Z_3Z_4h)*(C\ \text{AND}\ Y_1Y_2Y_3Y_4h)+(B\ \text{AND}\ Z_1Z_2Z_3Z_4h)*(C\ \text{AND}\ Z_1Z_2Z_3Z_4h),\ \text{where}\ Y_1Y_2Y_3Y_4h+Z_1Z_2Z_3Z_4h=\text{FFFFh} \qquad \text{Equation 9c}$$

In the fifth example of diverse multiplication, symbols A, B and C represent variables similarly described with respect to the first example of diverse addition. Furthermore, the mask values are similar to those described with respect to the second example of diverse addition. Thus, the equations are mathematically equivalent.

A sixth example of diverse multiplication algorithms is provided:

$$FW1)\ A=B*C \qquad \text{Equation 10a}$$

$$FW2)\ D1=B+C;$$

$$D2=B-C;\ \text{and}$$

$$A=[(D1*D1)-(D2*D2)]/4 \qquad \text{Equation 10b}$$

In the fifth example of diverse multiplication, symbols A, B and C represent variables similarly described with respect to the first example of diverse addition. Furthermore, D1 and D2 are function results. Thus, the equations are mathematically equivalent.

A first example of diverse polynomial algorithms, using polynomials of the second order, is provided:

$$FW1)\ A=aX^2+bX+c \qquad \text{Equation 11a}$$

$$FW2)\ A=(aX+b)*X+c \qquad \text{Equation 11b}$$

A is a function result (e.g., a magnetic field value, offset value, gain value, etc.), X is an output from a sensor, and a, b and c are constant values. In particular, X may be a compensation signal (e.g., temperature) for linearization, or a measurement signal, if, for example, any polynomial correction of a transfer-function is needed. Thus, the equations are mathematically equivalent.

A second example of diverse polynomial algorithms, using polynomials of the second order, is provided:

$$FW1)\ A=aX^2+bX+c \qquad \text{Equation 12a}$$

$$FW2)\ A=((a*d)X^2+(b*d)X+c*d)/d \qquad \text{Equation 12b}$$

In addition to the symbols described in the first example of diverse polynomials, d may be any arbitrary number, either fixed or changing every calculation, or a binary fraction number which is easy to calculate in binary systems. Thus, the equations are mathematically equivalent.

A third example of diverse polynomial algorithms, using polynomials of the third order, is provided:

$$FW1)\ A=aX^3+bX^2+cX+d \qquad \text{Equation 13a}$$

$$FW2)\ A=[(aX+b)*X+c]*X+d \qquad \text{Equation 13b}$$

In the third example of diverse polynomials, symbols A, B and C represent variables similarly described with respect to the first example of diverse addition. Thus, the equations are mathematically equivalent.

A fourth example of diverse polynomial algorithms, using polynomials of the third order, is provided:

$$FW1)\ A=aX^3+bX^2+cX+d \qquad \text{Equation 14a}$$

$$FW2)\ A=((a*e)X^3+(b*e)X^2+(c*e)X+d*e)/e \qquad \text{Equation 14b}$$

In addition to the symbols described in the first example of diverse polynomials, d could be any arbitrary number, either fixed or changing every calculation, or a binary fraction number which is easy to calculate in binary systems. In addition, e is a further constant variable. Thus, the equations are mathematically equivalent.

In addition, in any of the above examples, a first algorithm of firmware FW1 or FW2 may be implemented, and a second algorithm of firmware FW2 or FW1 may be an inverted implementation of the first algorithm. Alternatively, to create a diverse implementation, one or more of the measurements (i.e., measurement signals) or outputs of a sensor may be inverted prior to using the measurement or output in firmware. For example, a measurement signal may be input to firmware FW1 and the inverse of the measurement signal may be input to firmware FW2. Alternatively, a first measurement signal may be input to firmware FW1 and an inverse of another measurement signal may be input to firmware FW2.

Thus, in one or more embodiments, diverse FW (e.g., FW1 and FW2) utilize measurements of the same physical quantity or quantities (i.e., non-inverse), and in other one or more embodiments, diverse FW (e.g., FW1 and FW2) utilize measurements of the same physical quantity or quantities and one channel with an inverse polarity to the other channel (i.e., inverse). One of the firmwares may then use inverse functions (i.e., inverse to the other firmware) to compensate for the opposite polarity when calculating the result.

It will be appreciated that a first result R1 of a first firmware FW1 and a second result R2 of a second firmware FW2 may be analyzed to determine whether the results are equal to each other (e.g. R1=R2) or are less than (or less than or equal to) a predetermined margin or threshold (e.g., |R1−R2|<margin 1 or |R1+R2|<margin 2, where |"x"| indicates the absolute value of x and margin 1 and margin 2 can be the same or different). It is noted that the margin or threshold may be zero or some other value.

The diverse firmware codes, such as those above, may be classified according to their capability of detecting calculation errors induced by systematic hardware faults inside the two identical processors PROC1 and PROC2.

For this the following facts about processors should be considered. A processor (e.g., PROC1 and PROC2) includes control structures and data path structures as shown in FIG. 3.

Figure 3:
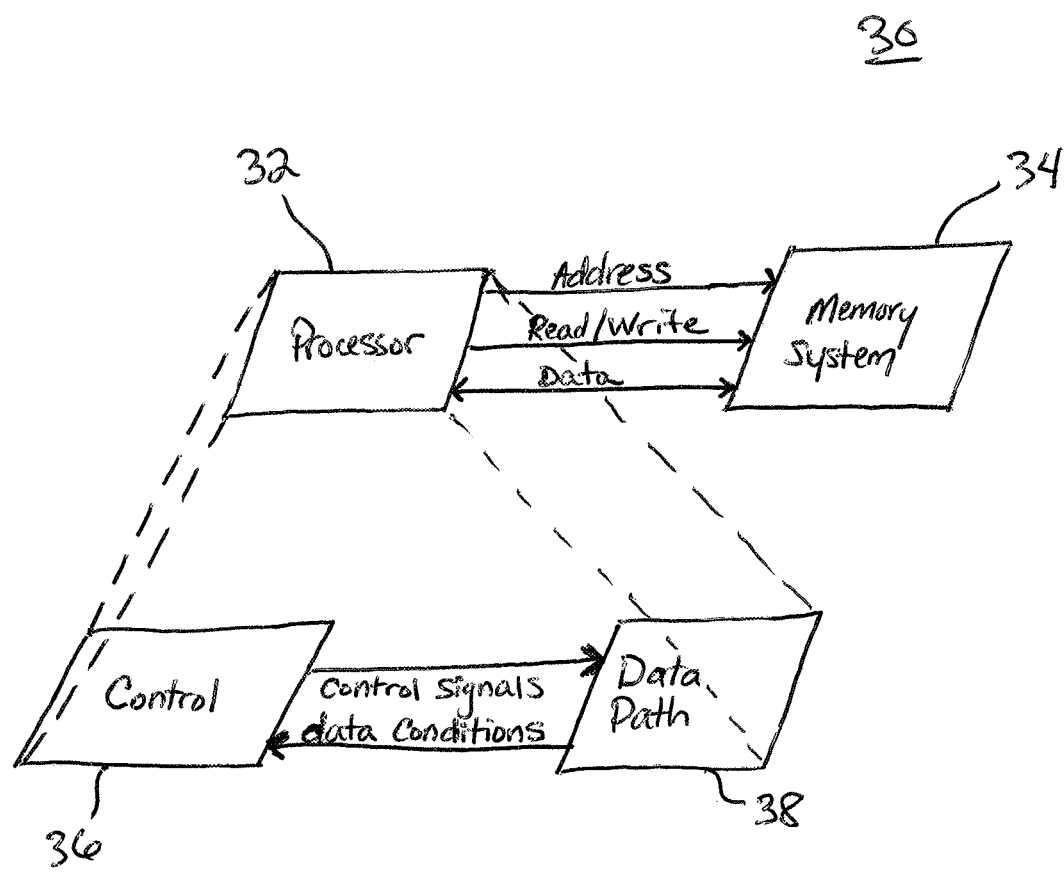
FIG. 3 is a block diagram of a computer system according to one or more embodiments.

FIG. 3 shows a block diagram of a computer system 30 having a processor 32 (e.g., a central processing unit (CPU)) in communication with a memory system 34. The processor 32 further includes one or more control structures 36 (e.g., an instruction unit) and one or more data path structures 38 (e.g., an execution unit). The control path unit 36 may fetch instructions and interpret by a finite-state machine (FSM). The data path unit 38 may include functional units and registers.

According to FIG. 3, a processor function is composed of a control path and a data path. The control structure(s) 36 are responsible for firmware program flow, interpretation of firmware codes and initiation of calculation actions. Typical elements of control structures are program counters, instruction registers, code interpretation units, microcode, code fetch units, etc. Data path structure(s) 38 are responsible for the transport of data, storage of intermediate data results, and execution of basic logic and mathematical operations. Typical elements of a data path structure are accumulators, data registers, adders, multipliers, shift units, etc.

The proposed diverse codes FW1, FW2 are seen as especially effective for the following categories of systematic failures noted in Table 1.

TABLE 1

| | | Effectivity of Diverse Firmware implementation Type for detection of fault | | |
| --- | --- | --- | --- | --- |
| | | Diverse Addition | Diverse Multiplication | Diverse Polynomials |
| Control or Data Path | Systematic Failure Mode of Processor PROC (affecting both PROC1 and PROC2) | Effective | Effective | Effective |
| Control Path | Unintended execution sequence, omission of command, additional command (program counter, ROM interface - stuck at, open, oscillation) | Effective | Effective | Effective |

TABLE 1-continued

| | | Effectivity of Diverse Firmware implementation Type for detection of fault | | |
| --- | --- | --- | --- | --- |
| | | Diverse Addition | Diverse Multiplication | Diverse Polynomials |
| Control Path | Fault in command interpretation (control logic, ROM interface - stuck at, open, oscillation) | Effective | Effective | Effective |
| Data Path | Wrong results due to logic or arithmetic fault (DSP or processor), working register, accelerator hardware - stuck at, open, oscillation) | Effective | Effective | Effective |

A systematic failure may indicate a specification fault or design problem within the system that causes a failure. With the usage of two diverse FWs, there is a high probability that, in the event of a systematic fault, both FWs will produce erroneous results at substantially the same time. Therefore, a systematic fault can be detected by determining that the results output from the firmware are incorrect and that these faulty results were detected at substantially the same time.

An unintended execution sequence, omission of command or additional command may indicate that one or more of the processors may have executed different commands than was expected or inserted an extra command in its operation (e.g., executed a command twice) that results in an incorrect result.

A fault in command interpretation may indicate that one or more of the processors may have interpreted an operation command or instruction incorrectly, which led to a wrong execution of a command.

A wrong result due to logic or arithmetic fault may indicate that one or more of the processors produced a wrong result (e.g., intermediate result) during its operation of the firmware, which caused a different effect (i.e., a wrong final result).

The proposed diverse codes FW1, FW2 are also effective for detection of random hardware faults. Random hardware faults follow a probability distribution and are always present but are non-systematic. They can be subdivided into hard errors or soft errors. Examples are noted in Table 2.

TABLE 2

| | | Effectivity of Diverse Firmware implementation Type for detection of fault | | |
| --- | --- | --- | --- | --- |
| | | Diverse Addition | Diverse Multiplication | Diverse Polynomials |
| Control Path or Data Path | Random Failure Mode of Processors PROC1 and/or PROC2) | Effective | Effective | Effective |

TABLE 2-continued

| | | Effectivity of Diverse Firmware implementation Type for detection of fault | | |
|---|---|---|---|---|
| | | Diverse Addition | Diverse Multiplication | Diverse Polynomials |
| Memory | Processor RAM-errors (Soft errors caused by alpha-particles, radiation and noise, for instance) | Effective | Effective | Effective |

Processor RAM-errors may indicate one or more failures inside a memory which may cause a different effect in the execution of one or more of the firmware FW1, FW2.

In view of Tables 1 and 2, each firmware FW1, FW2 may include one or more types of algorithms (e.g., addition, multiplication, polynomials, etc.) such that an algorithm in one firmware is paired or linked with another, mathematically equivalent, but diverse, algorithm in another firmware, and a type of algorithm may be selected by one or more of the processors PROC1, PROC2 or a control unit based on the type of error/fault desired to be tested.

Time diversity of software and/or firmware may also be provided. For example, an additional possibility would be to implement time diverse software/firmware processing. As a characteristic feature diverse (different) sampling and processing times may be selected for each firmware FW1 and FW2 and combined to form two diverse results with the identical average age. The result age is defined as the time delay between a sampling time and the result output time. Thus, a sampling time of a measurement and processing time for firmware FW1 may be selected according to a first average age, and a sampling time of a measurement and processing time for firmware FW2 may be selected according to a second average age, such that the first average age and the second average age is identical. One or more of the sampling times and processing times for each firmware may be the same or different as long as the average age for each firmware is identical. Thus, the expected results of firmware FW1 and FW2 implementing time diversity are the same or within a predetermined margin, as described above, and the results of each firmware can be analyzed to determine whether an error exists or not.

In addition, two or more measurement passes may be performed for each firmware FW1, FW2 such that the combined average age of FW1 for each measurement pass is identical to the combined average age of FW2 for each measurement pass. Thus, the average age of two or more measurement samples in FW1 is identical to the average age of two or more measurement samples in FW2, such that the expected results of FW1 and FW2 are the same or within a predetermined margin, as described above.

Thus, as an example, a first measurement includes a plurality of first measurements sampled at a plurality of first sampling times that define a first average sampling time when averaged together, and the second measurement includes a plurality of second measurements sampled at a plurality of second sampling times that define a second average sampling time that is equal to the first average sampling time. A first processor is configured by executing firmware FW1 to calculate a first measurement average of the plurality of first measurements and to calculate a first result based on the first measurement average. Similarly, a second processor is configured by executing firmware FW2 to calculate the second measurement average of the plurality of second measurements and to calculate a second result based on the second measurement average. The first and the second results are compared to determine whether a fault exists or if both processors, and the system as a whole, are operating normally.

By using time diversity, redundant sensor channels, which are evaluating the same physical quantity (e.g., magnetic field, temperature, pressure, stress, etc.), may be measured and monitored. Furthermore, by using time diversity on redundant sensor channels, measurements can be triggered either by the hardware or software at a same sampling time (e.g., in order to obtain the same signal age of both channels) of both channels or at different time slots (i.e., different sampling times) in order to ensure that the measured quantities are not affected by the same disturbance. That is, a disturbance affecting one or more sensor channels may be present at one instance in time, but perhaps not at another instance in time.

The sampled values may processed by the firmware and/or software at different time slots (i.e., different processing times), either scheduled by hardware, firmware and/or software, in order to ensure that in case of disturbances the firmware/software processing of the redundant sensor channels is not effected in the same way.

The processing of sampled values may include one or more of the following operations: calculating of compensation algorithms regarding, for example, temperature- and stress-effects (or other physical quantity-effect), performing of safety mechanism for each redundant sensor channel (e.g., performing range checks of the inputs signals, etc.), and cross-checking between processed measurement data of each sensor channel (e.g., comparison of temperature or other physical quantity, plausibility checks, etc.). In addition, additional information transmitted by a digital protocol (e.g. Peripheral Sensor Interface 5 (PSI5), Short Pulse Width Modulation (PWM) Code (SPC) protocol, etc.) may be handled with the measurement data (e.g., a rolling counter, time stamp, etc.)

Figure 4A:
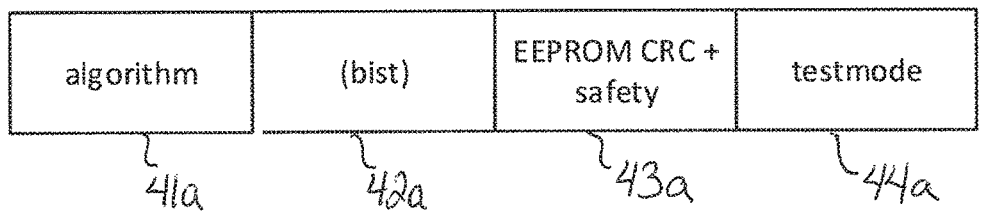
FIGS. 4*a* and 4*b* show examples of time diverse firmware/software scheduling according to one or more embodiments.
Figure 4B:
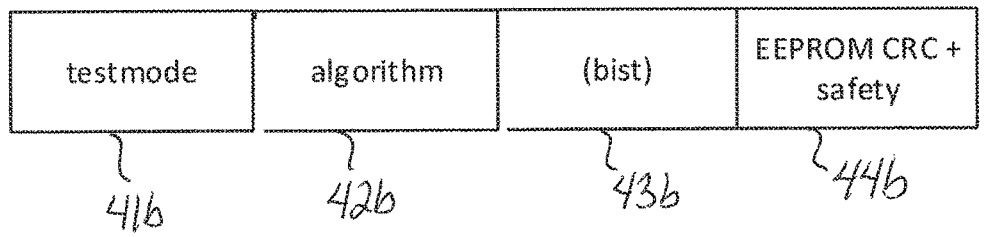

FIGS. 4a and 4b show an example of a scheduling implementation of a time diverse firmware and/or software implementation.

In particular, FIG. 4a shows a scheduling implementation for firmware FW1 such that an algorithm is executed in a first time slot 41a, a built-in self-test (BIST) is performed in a second time slot 42a, an EEPROM cyclic redundancy check (CRC) and safety test is performed in a third time slot 43a, and a testmode is performed in a fourth time slot 44a.

Similarly, FIG. 4b shows a scheduling implementation for firmware FW2 having four time slots with a different procedural implementation (e.g., shifted at least one time slot) than FW1. For example, a testmode is performed in a first time slot 41b, an algorithm is executed in a second time slot 42b, a built-in self-test (BIST) is performed in a third time slot 43b, an EEPROM cyclic redundancy check (CRC) and safety test is performed in a fourth time slot 44b.

In view of the above, diverse time and/or firmware implementation may be especially valuable for the case of multi-channel sensors (i.e., sensors having at least two channels). A direct 1:1 comparison between the results of each channel (like in the coded processing) may not be feasible since each channel has a certain measurement tolerance which leads to the fact that the result numbers may not be identical. However, each channel may be connected to one of the identical processors having diverse firmware and/or time diversity, and the results compared such that a difference between the results is compared to a predetermined margin tolerance or threshold tolerance to determine whether an error exists or not, as described above.

Accordingly, a diverse redundant safety function may be realized based on identical hardware implementation of microprocessors. This may avoid an error prone implementation of the identical functionality two times in hardware. The verification quality of the hardware is greatly increased for a given verification effort. Moreover, the risk that corner cases behaving differently in an unintended manner may be reduced.

Figure 5:
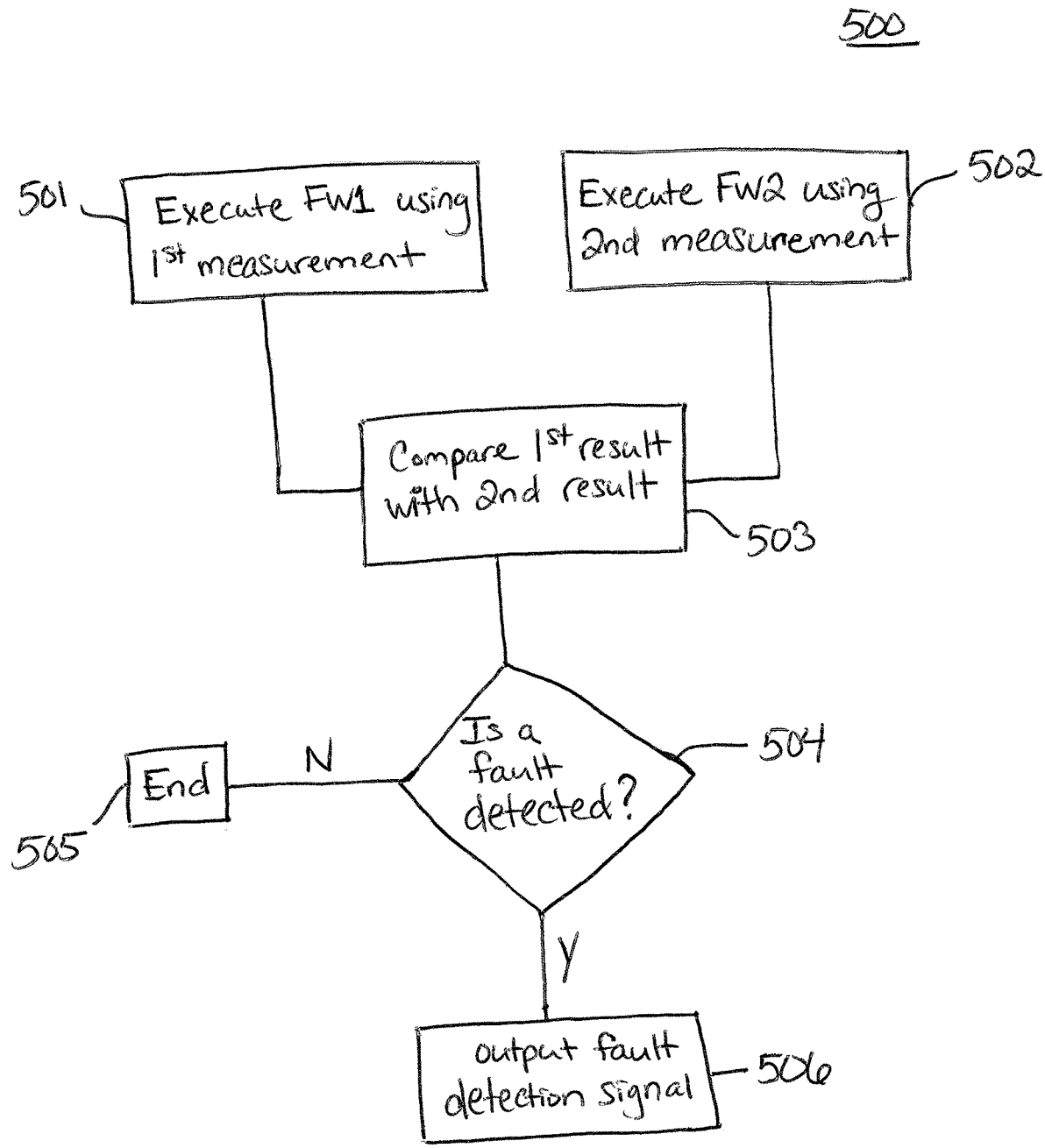
FIG. 5 illustrates a flow diagram of an example fault detection method according to one or more embodiments.

FIG. 5 illustrates a flow diagram of an example fault detection method 500. The method includes executing a first diverse firmware, by a first processor, using a first measurement as an input and generate a first result (operation 501) and executing a second diverse firmware, by a second processor identical to the first processor, using a second measurement as an input and generate a second result (operation 502). The method 500 may also include measuring the first and the second measurements by one or more sensors, and receiving, by the first and the second processors, the respective first and second measurements. The method 500 further includes comparing, by a comparison component, the first and the second results (operation 503) and determining, by a determining component, whether a fault is detected based on the comparison result (operation 504). If a fault is not detected, the process ends (operation 505). In addition, if a fault is not detected, a normal condition detection signal may be output by the determining component. Furthermore, the process may start over for further (continuous) testing. If a fault is detected, a fault detection signal is output by the determining component (operation 506). Furthermore, the process may start over for further (continuous) testing.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A fault detection system, comprising:
   a first processor configured to receive a first set of variables, execute a first firmware based on the first set of variables, and output a first result of the executed first firmware; and
   a second processor identical to the first processor and configured to receive a second set of variables, execute a second firmware based on the second set of variables, and output a second result of the executed second firmware;
   wherein the first firmware and the second firmware provide a same nominal function in a diverse manner for calculating the first result and the second result, respectively, such that the first result and the second result are expected to be within a predetermined margin.

2. The fault detection system of claim 1, wherein:
   the first processor is configured to execute the first firmware based on the first set of variables by applying the first set of variables to a first algorithm, and
   the second processor is configured to execute the second firmware based on the second set of variables by applying the second set of variables to a second algorithm that is an inverted implementation of the first algorithm.

3. The fault detection system of claim 2, further comprising:
   an inverter configured to invert one of the first set of variables or the second set of variables prior to being input into the first firmware or the second firmware, respectively.

4. The fault detection system of claim 1, further comprising:
   a sensor configured to measure a physical quantity and generate the first set of variables and the second set of variables based on the measured physical quantity.

5. The fault detection system of claim 1, further comprising:
   a third processor configured to compare the first result with the second result to determine whether a fault exists based on a comparison result and the predetermined margin.

6. The fault detection system of claim 1, further comprising:
   a first comparison component configured to compare the first result with the second result and output a comparison result; and
   a second comparison component configured to receive the comparison result and to determine whether a fault exists based on the comparison result and the predetermined margin.

7. The fault detection system of claim 1, wherein the first firmware and the second firmware are diverse, mathematically-equivalent algorithms.

8. The fault detection system of claim 1, further comprising:
   an integrated circuit comprising:
      the first processor;
      the second processor; and
      a memory configured to store the first firmware and the second firmware and is electrically connected to the first processor and the second processor.

9. The fault detection system of claim 1, further comprising:
an integrated circuit comprising:
the first processor;
the second processor;
a first memory configured to store the first firmware and is electrically connected to the first processor; and
a second memory configured to store the second firmware and is electrically connected to the second processor, wherein the second memory is separate from the first memory.

10. The fault detection system of claim 1, further comprising:
a sensor including a first sensor channel and a second sensor channel, wherein the first processor is configured to receive the first set of variables from the first sensor channel and the second processor is configured to receive the second set of variables from the second sensor channel.

11. The fault detection system of claim 10, wherein the second sensor channel has an inverse polarity to the first sensor channel.

12. The fault detection system of claim 1, further comprising:
a first sensor configured to measure a first physical quantity and output the first set of variables based on the measured first physical quantity to the first processor; and
a second sensor configured to measure a second physical quantity and output the second set of variables based on the measured second physical quantity to the second processor.

13. The fault detection system of claim 1, wherein the first firmware and the second firmware are linked to each other, and
the first processor selects the first firmware from a plurality of firmware stored in at least one memory based on a type of fault to be detected such that the first processor executes the first firmware and the second processor executes the second firmware linked to the first firmware.

14. The fault detection system of claim 1, wherein a sampling time of the first set of variables and a sampling time of the second set of variables are the same.

15. The fault detection system of claim 1, wherein a processing time of the first firmware and a processing time of the second firmware are different.

16. A fault detection method, comprising:
executing a first firmware, by a first processor, including receiving a first set of variables, executing a first algorithm based on the first set of variables, and outputting a first result of the executed first algorithm; and
executing a second firmware, by a second processor identical to the first processor, including receiving a second set of variables, executing a second algorithm based on the second set of variables, and outputting a second result of the executed second algorithm,
wherein the first firmware and the second firmware provide a same nominal function in a diverse manner for calculating the first result and the second result, respectively, such that the first result and the second result are expected to be within a predetermined margin.

17. The fault detection method of claim 16, the second algorithm is an inverted implementation of the first algorithm.

18. The fault detection method of claim 17, further comprising:
inverting one of the first set of variables or the second set of variables prior to being input into the first firmware or the second firmware, respectively.

19. The fault detection method of claim 16, further comprising:
comparing the first result with the second result and outputting a comparison result;
determining whether a fault exists based on the comparison result and the predetermined margin; and
outputting a fault detection signal on a condition that the fault is detected.

20. The fault detection method of claim 16, wherein the first firmware and the second firmware are linked to each other, and the fault detection method further comprises:
selecting the first firmware from a plurality of firmware stored in at least one memory based on a type of fault to be detected such that the first processor executes the first firmware and the second processor executes the second firmware linked to the first firmware.

* * * * *